United States Patent
Chang

(10) Patent No.: US 6,376,300 B1
(45) Date of Patent: Apr. 23, 2002

(54) PROCESS OF MANUFACTURING TRENCH CAPACITOR HAVING A HILL STRUCTURE

(75) Inventor: Chih-Sheng Chang, Hsinchu (TW)

(73) Assignee: Mosel Vitelic, Inc. (TW)

( * ) Notice: Subject to any disclaimer, the term of this patent is extended or adjusted under 35 U.S.C. 154(b) by 0 days.

(21) Appl. No.: 09/687,254

(22) Filed: Oct. 12, 2000

(30) Foreign Application Priority Data

Nov. 10, 1999 (TW) .......................................... 88117535

(51) Int. Cl.$^7$ .......................................... H01L 21/8242
(52) U.S. Cl. ........................ 438/246; 438/249; 438/289
(58) Field of Search ................................ 438/246, 249, 438/389, 392, FOR 220

(56) References Cited

U.S. PATENT DOCUMENTS

| | | | |
|---|---|---|---|
| 4,859,622 A | * | 8/1989 | Eguchi |
| 5,429,978 A | * | 7/1995 | Lu et al. |
| 5,470,778 A | * | 11/1995 | Nagata et al. |
| 5,656,532 A | * | 8/1997 | Tseng |

* cited by examiner

*Primary Examiner*—Wael Fahmy
*Assistant Examiner*—Joannie Adelle Garcia
(74) *Attorney, Agent, or Firm*—Skjerven Morrill MacPherson LLP

(57) ABSTRACT

A process of manufacturing a trench capacitor having a hill structure includes the steps of providing a semiconductor substrate, forming a passivation layer on the semiconductor substrate, etching the passivation layer to form a trench defined by a side wall and a bottom surface, forming a spacer on the side-wall, wherein the bottom surface includes a first part covered by the spacer and a second part exposed from the spacer, forming a sacrificial layer between the spacer and the second part, and removing the sacrificial layer until the spacer has been fully removed to expose the first part wherein an etched rate of the sacrificial layer is slower than that of the spacer, thereby forming the trench capacitor with the hill structure.

20 Claims, 7 Drawing Sheets

PROCESS OF MANUFACTURING TRENCH CAPACITOR HAVING A HILL STRUCTURE

FIELD OF THE INVENTION

The present invention is related to a semiconductor process, and especially to a process for manufacturing a trench capacitor having a hill structure.

BACKGROUND OF THE INVENTION

In the semiconductor process of dynamic random access memory (DRAM), many capacitors are required to construct memory cells for storing the digital data by way of electrical charges. It is an important topic to effectively manufacture more capacitors into a memory IC having a fixed size. There are many structure in the capacitor manufacture. Here the trench capacitor will be mentioned.

Please refer to FIG. 1(a) and FIG. 1(b) showing two DRAM memory cells respectively using the trench capacitor C1 and C2. Each capacitor have a first plate 11, an insulation layer 12 and a polysilicon layer 13. However, its capacitance is constrained by the effective area on sidewall of the trench thereby obstructing the density improvement of DRAM.

Please refer to FIG. 2 showing a trench capacitor having a hill structure without the defect of the capacitor shown in FIG. 1. This trench capacitor has a hill structure 21 formed in the trench for increasing the effective plate area of the trench capacitor. FIG. 3(a) to FIG. 3(c) shows the detailed process flow of fabricating this trench capacitor.

Please refer to FIG. 3(a) showing that an oxide layer 32 is formed on the side-wall of the trench 31 formed on a semiconductor substrate 30 and a surface 301 is exposed after an etching back process.

Please refer to FIG. 3(b) showing that a substrate contact 33 lower than the oxide layer 32 is formed by etching the exposed surface 301 into the semiconductor substrate 30.

As shown in FIG. 3(c), a poysilicon layer is deposited between the contact 33 and the oxide layer 32 and then the oxide layer 32 is etched with HF for forming the hill structure 21. Finally, the trench capacitor having the hill structure in FIG. 2 is fabricated after forming a plate and an insulation layer on the hill structure 21.

However, the above-mentioned conventional process has the following defects:

(1) a contact etching is required for connecting the hill structure of the capacitor with the semiconductor substrate, so the process is complicated.

(2) the contact is positioned in a depth, so the etching process is difficult to implement.

(3) the capacitor has a defect in electricity because the hill structure will results in a contact resistance between the contact and the first plate.

SUMMARY OF THE INVENTION

An object of the present invention is to provide an easier process for manufacturing the capacitor having a hill structure.

Another object of the present invention is to reduce the manufacture process and to lower the manufacturing cost.

According to the present invention, the process of manufacturing a trench capacitor having a hill structure includes the steps of providing a semiconductor substrate, forming a passivation layer on the semiconductor substrate, etching the passivation layer to form a trench defined by a side wall and a bottom surface, forming a spacer on the side-wall, wherein the bottom surface includes a first part covered by the spacer and a second part exposed from the spacer, forming a sacrificial layer between the spacer and the second part, and removing the sacrificial layer until the spacer has been fully removed to expose the first part wherein an etched rate of the sacrificial layer is slower than that of the spacer, thereby forming the trench capacitor with the hill structure.

In according with one aspect of the present invention, the semiconductor substrate is made of silicon.

In according with one aspect of the present invention, the passivation layer includes a pad oxide layer, a pad silicon nitride layer, a borosilicate glass (BSG), and a silicon oxynitride layer.

In according with one aspect of the present invention, the trench is formed by photolithography and an etching process.

In according with one aspect of the present invention, the spacer is made of polysilicon.

In according with one aspect of the present invention, the sacrificial layer is made of BSG.

In according with one aspect of the present invention, the hill structure is surrounded by a valley formed in the first part of the semiconductor substrate for increasing an effective area of the trench capacitor having the hill structure.

In according with one aspect of the present invention, surfaces of the hill structure and the valley are doped with a conductive material for forming a first plate of the trench capacitor having the hill structure.

In according with one aspect of the present invention, an insulation layer is formed on the hill structure and in the valley for forming an area for storing an electric charge.

In according with one aspect of the present invention, the conductive material is applied on the insulation layer for forming a second plate of the trench capacitor having the hill structure.

According to the present invention, the process of manufacturing a trench capacitor having a hill structure comprising steps of providing a semiconductor substrate having a trench defined by a side wall and a bottom surface, forming a spacer on the side wall, the spacer covering a first part of the bottom surface but exposing a second part of the bottom surface, forming a sacrificial layer on the substrate and the spacer, firstly removing the sacrificial layer, the substrate and the spacer until the second part is exposed, and the semiconductor substrate under the first part is removed for a certain depth, and secondly removing further the semiconductor substrate under the first part and the second part simultaneously for forming the trench capacitor having a hill structure.

In according with one aspect of the present invention, the semiconductor substrate has a passivation layer formed on the trench, and the semiconductor is made of silicon.

In according with one aspect of the present invention, the passivation layer includes a pad oxide layer, a pad silicon nitride layer, a BSG layer, and a silicon oxynitride layer, and the trench is formed by a hotolithography and an etching process.

In according with one aspect of the present invention, before the firstly removing step, the spacer has been fully removed, but the sacrificial layer above the second part still has a certain height.

In according with one aspect of the present invention, the spacer is made of polysilicon.

In according with one aspect of the present invention, the sacrificial layer is made of BSG.

In according with one aspect of the present invention, the hill structure is surrounded by a valley formed in the first part of the semiconductor substrate for increasing an effective area of the trench capacitor having the hill structure.

In according with one aspect of the present invention, surfaces of the hill structure and the valley are doped with a conductive material for forming a first plate of the trench capacitor having the hill structure.

In according with one aspect of the present invention, an insulation layer is formed on the hill structure and in the valley for forming an area for storing an electric charge.

In according with one aspect of the present invention, the conductive material is applied on the insulation layer for forming a second plate of the trench capacitor having the hill structure.

The present invention may best be understood through the following description with reference to the accompanying drawings, in which:

DETAILED DESCRIPTION OF THE PREFERRED EMBODIMENT

Please refer to FIGS. 4(a)~(d) showing the process for fabricating a trench capacitor having a hill structure.

Figure 1A:
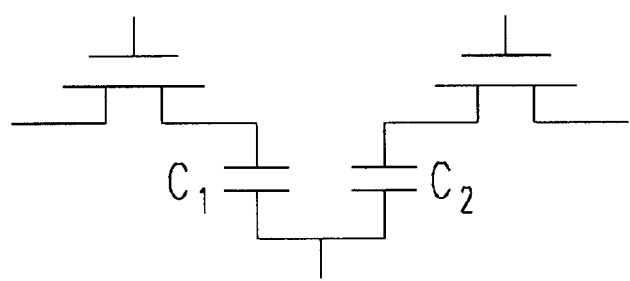
FIG. 1(a) is a schematic diagram showing a conventional circuit of DRAM memory cells.
Figure 1B:
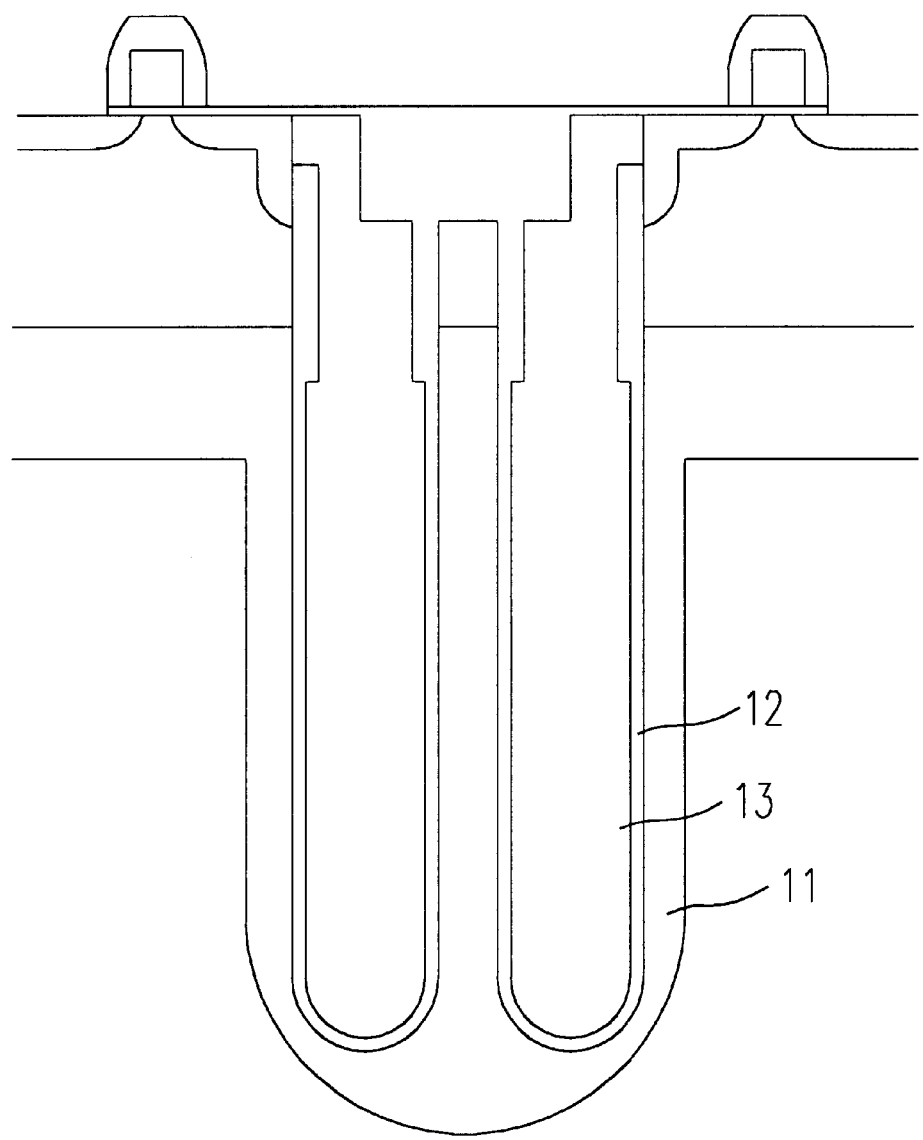
FIG. 1(b) is a schematic diagram showing two conventional trench capacitors used in the DRAM memory.
Figure 2:
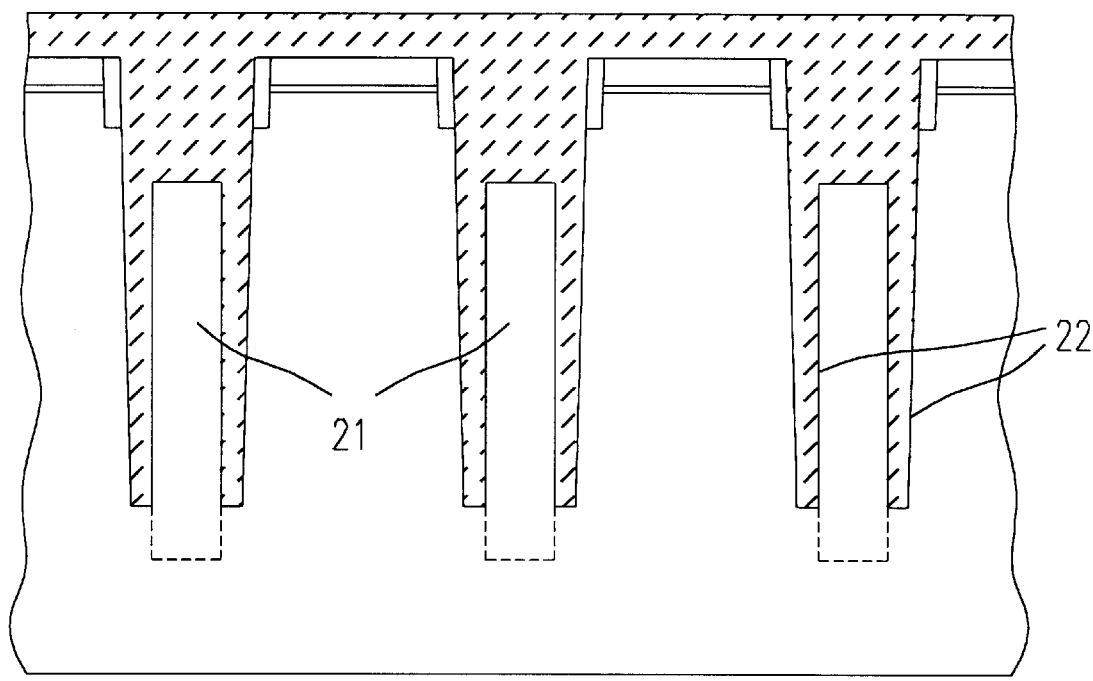
FIG. 2 is a schematic diagram showing another conventional trench capacitors having a hill structure.
Figure 3A:
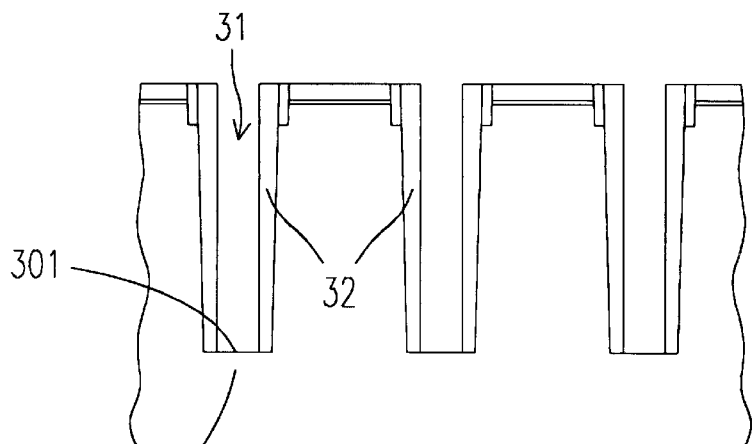
FIGS. 3(a)~(c) are schematic diagrams showing the manufacturing process of the conventional trench capacitors shown in FIG. 2.
Figure 3B:
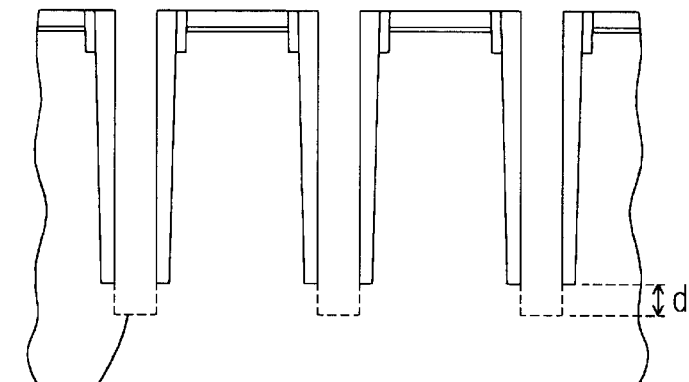
Figure 3C:
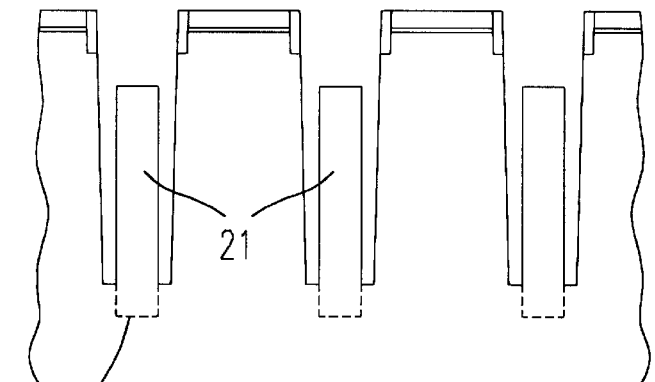
Figure 4A:
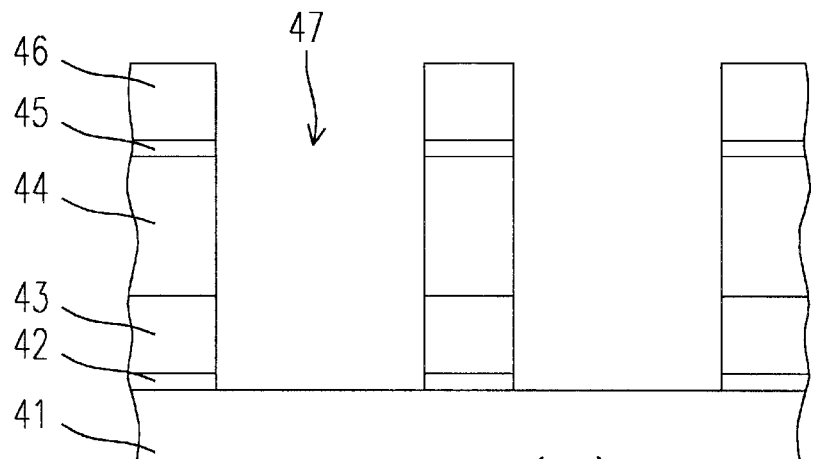
FIGS. 4(a)~(d) are schematic diagrams showing a preferred embodiment of the manufacture process of the trenched capacitor according to the present invention.

FIG. 4(a) shows that a passivation layer is formed on the semiconductor substrate 41, wherein the passivation layer includes a pad oxide layer 42, a pad silicon nitride layer 43, a BSG layer 44, a silicon oxynitride layer 45. Then, a photo-resistor 46 is formed on the passivation layer and patterned for forming a trench 47 and exposing a portion of the substrate 41.

Figure 4B:
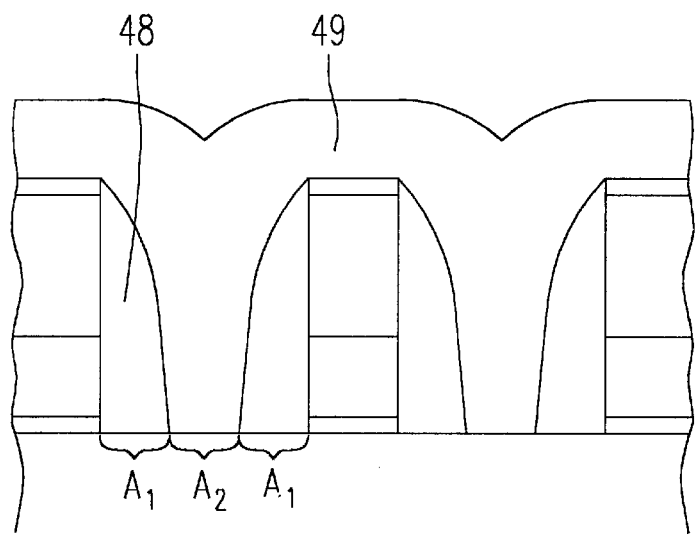

As shown in FIG. 4(b), after the photo-resistor 46 is removed, a polysilicon layer is formed on the sidewall of the trench and the first part A1 of the exposed substrate to serve as a spacer 48. Then a BSG layer 49 is deposited on the spacer 48, the second part A2 of the exposed substrate and the passivation layer to serve as a sacrificial layer.

Figure 4C:
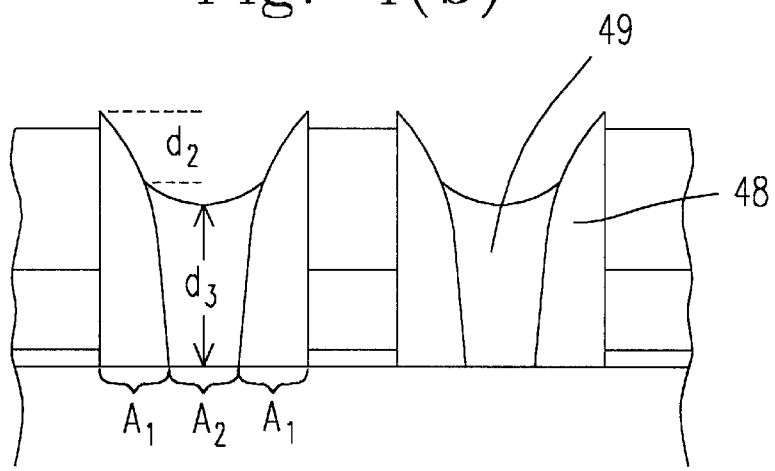

In FIG. 4(c), the BSG layer 49 is etched until the silicon oxynitride layer 45 is etched. At the same time the BSG layer 49 on the spacer 48 is etched to a depth d2. The remained height d3 of the BSG layer 49 is used to control the depth of the hill structure sinking in the semiconductor substrate 41.

Figure 4D:
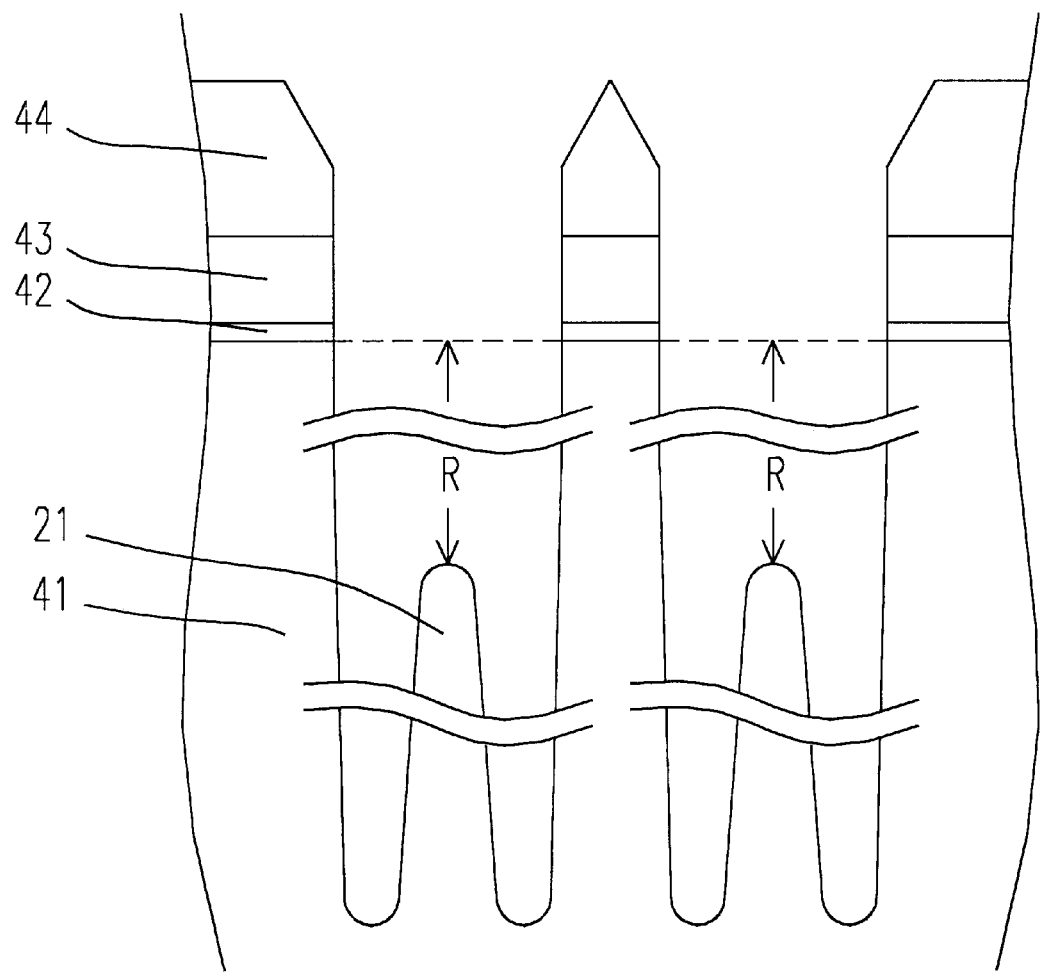

In the method of present invention, the etched rate of the spacer 48 is greater than that of BSG layer 49 so that the spacer 48 will be removed firstly and the first part A1 will be exposed, while the BSG is still remained in a certain height. When the etching is kept on, the area under the first part A1 will be etched and the BSG layer 49 will also be etched. Finally, the second part A2 will be exposed until the BSG layer 49 is removed completely. At this time, the area under the first part A1 is etched to a certain depth, and thus the profile of the hill structure of the capacitor is formed. As long as the etching process is continuously performed the hill structure is sunk into the semiconductor substrate in a certain depth R, and the trench capacitor having the hill structure will be formed, as shown in FIG. 4(d).

Figure 5:
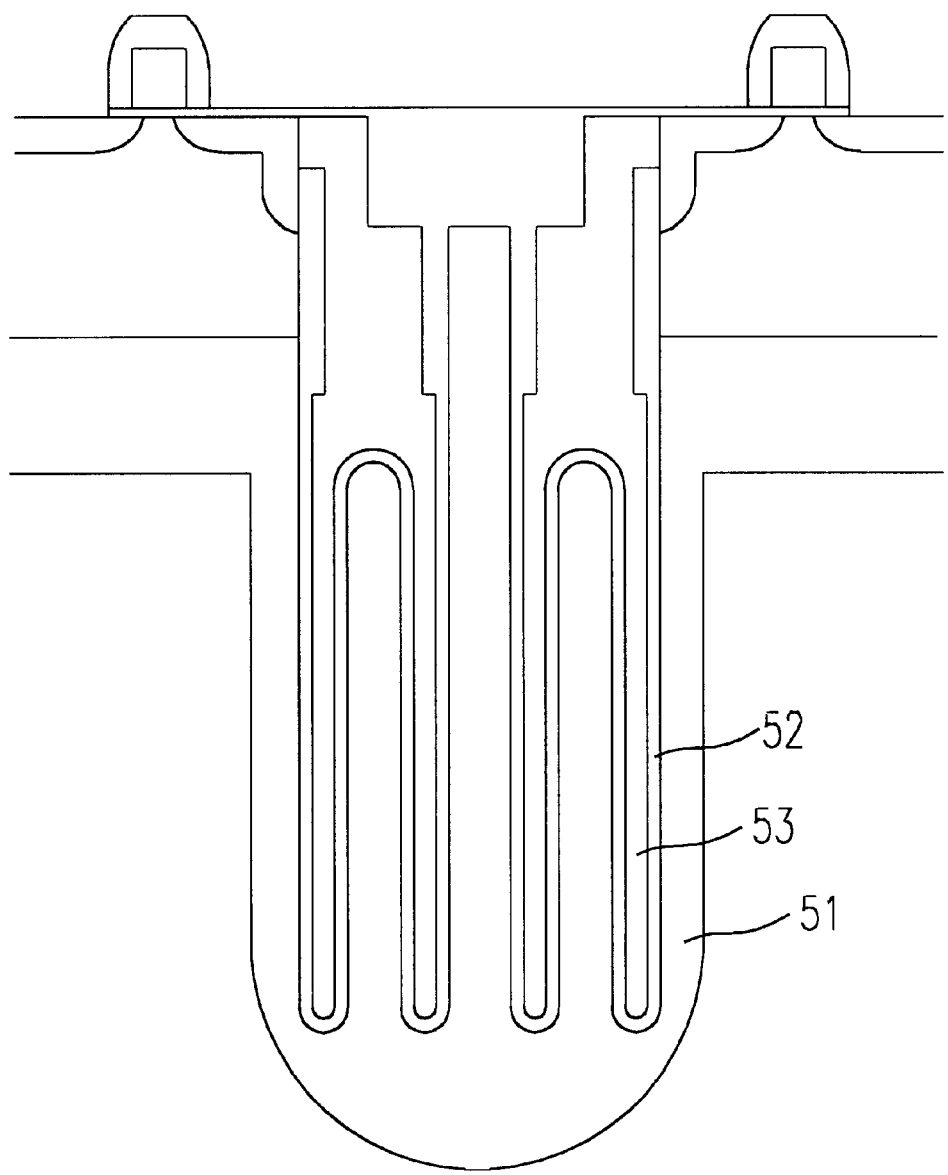
FIG. 5 is a schematic diagram showing two trench capacitors having a hill structure according to the present invention.

FIG. 5 shows two DRAM memory cells structure using two trench capacitors having the hill structure of the present invention, wherein the hill structure is surrounded by a valley formed in the first part of the substrate, and the surfaces of hill and valley are doped with an dopant so as to form a first plate 51. The insulation layer 52 can be an oxide-nitride(ON) structure. The second plate 53 is a polysilicon formed by a deposition method.

The major difference between the present invention and the prior arts is that the hill structure is formed by etching the substrate, but not by deposition, so that the electric characteristic will be better than those of the prior arts. In addition, the method for forming the hill structure in the substrate by etching will be easier.

In conclusion, the advantages of the present invention have:

1. Because the hill structure is formed by etching process, the material of the hill structure is the same as that of the semiconductor substrate and thus the process becomes much easier; and 2. The first plate is formed on the surfaces of the hill structure and the semiconductor substrate without need a contact, so a better electric characteristic will be obtained, and the yield rate will be improved.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process of manufacturing a trench capacitor having a hill structure comprising steps of:

providing a semiconductor substrate;

forming a passivation layer on said semiconductor substrate;

etching said passivation layer to form a trench having a side wall and a bottom surface;

forming a spacer on said side-wall, wherein said bottom surface includes a first part covered by said spacer and a second part exposed from said spacer;

forming a sacrificial layer between said spacer and said second part; and removing said sacrificial layer until said spacer has been fully removed to expose said first part wherein an etched rate of said sacrificial layer is slower than that of said spacer, thereby forming said trench capacitor with said hill structure.

2. A process according to claim 1 wherein said semiconductor substrate is made of silicon.

3. A process according to claim 1 wherein said passivation layer includes a pad oxide layer, a pad silicon nitride layer, a borosilicate glass (BSG), and a silicon oxynitride layer.

4. A process according to claim 1 wherein said trench is formed by photolithography and an etching process.

5. A process according to claim 1 wherein said spacer is made of polysilicon.

6. A process according to claim 1 wherein said sacrificial layer is made of BSG.

7. A process according to claim 1 wherein said hill structure is surrounded by a valley formed in said first part of said semiconductor substrate for increasing an effective area of said trench capacitor having said hill structure.

8. A process according to claim 7 wherein surfaces of said hill structure and said valley are doped with a conductive material for forming a first plate of said trench capacitor having said hill structure.

9. A process according to claim 8 wherein an insulation layer is formed on said hill structure and in said valley for forming an area for storing electric charge.

10. A process according to claim 9 wherein said conductive material is applied on said insulation layer for forming a second plate of said trench capacitor having said hill structure.

11. A process of manufacturing a trench capacitor having a hill structure comprising steps of:
providing a semiconductor substrate having a trench defined by a side wall and a bottom surface;
forming a spacer on said side wall, said spacer covering a first part of said bottom surface but exposing a second part of said bottom surface;
forming a sacrificial layer on said substrate and said spacer;
firstly removing said sacrificial layer, said substrate and said spacer until said second part is exposed, and said semiconductor substrate under said first part is removed for a certain depth; and
secondly removing further said semiconductor substrate under said first part and said second part simultaneously for forming said trench capacitor having hill structure.

12. A process according to claim 11 wherein said semiconductor substrate has a passivation layer formed on said trench, and said semiconductor is made of silicon.

13. A process according to claim 12 wherein said passivation layer includes a pad oxide layer, a pad silicon nitride layer, a BSG layer, and a silicon oxynitride layer, and said trench is formed by a photolithography and an etching process.

14. A process according to claim 11 wherein before said firstly removing step, said spacer has been fully removed, but said sacrificial layer above said second part still has a certain height.

15. A process according to claim 11 wherein said spacer is made of polysilicon.

16. A process according to claim 11 wherein said sacrificial layer is made of BSG.

17. A process according to claim 11 wherein said hill structure is surrounded by a valley formed in said first part of said semiconductor substrate for increasing an effective area of said trench capacitor having said hill structure.

18. A process according to claim 17 wherein surfaces of said hill structure and said valley are doped with a conductive material for forming a first plate of said trench capacitor having said hill structure.

19. A process according to claim 18 wherein an insulation layer is formed on said hill structure and in said valley for forming an area for storing an electric charge.

20. A process according to claim 19 wherein said conductive material is applied on said insulation layer for forming a second plate of said trench capacitor having said hill structure.

* * * * *